(12) United States Patent
Kim et al.

(10) Patent No.: US 10,475,776 B2
(45) Date of Patent: Nov. 12, 2019

(54) FAN-OUT SEMICONDUCTOR PACKAGE MODULE

(71) Applicant: SAMSUNG ELECTRONICS CO., LTD., Suwon-si (KR)

(72) Inventors: Yeong A Kim, Suwon-si (KR); Eun Sil Kim, Suwon-si (KR); Young Gwan Ko, Suwon-si (KR); Akihisa Kuroyanagi, Suwon-si (KR); Jin Su Kim, Suwon-si (KR); Jun Woo Myung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/900,568

(22) Filed: Feb. 20, 2018

(65) Prior Publication Data

US 2019/0131285 A1    May 2, 2019

(30) Foreign Application Priority Data

Oct. 27, 2017 (KR) .................. 10-2017-0141139

(51) Int. Cl.
*H01L 25/16*    (2006.01)
*H01L 23/31*    (2006.01)
(Continued)

(52) U.S. Cl.
CPC .......... *H01L 25/16* (2013.01); *H01L 21/4857* (2013.01); *H01L 21/52* (2013.01);
(Continued)

(58) Field of Classification Search
CPC ....... H01L 25/16; H01L 24/08; H01L 21/568; H01L 23/49816; H01L 28/40;
(Continued)

(56) References Cited

U.S. PATENT DOCUMENTS 8,890,628 B2    11/2014 Nair et al.
2005/0122698 A1*    6/2005 Ho ..................... H01L 23/5389
361/761
(Continued)

FOREIGN PATENT DOCUMENTS

EP    1848029 A1    10/2007
JP    2011-061004 A    3/2011
(Continued)

OTHER PUBLICATIONS

Notice of Office Action dated Apr. 30, 2018, issued in Korean Patent Application No. 10-2017-0141139 (English translation).
(Continued)

*Primary Examiner* — Marcos D. Pizarro
*Assistant Examiner* — Sue Tang
(74) *Attorney, Agent, or Firm* — Sughrue Mion, PLLC

(57) ABSTRACT

A fan-out semiconductor package module includes a core member having first and second through-holes. A semiconductor chip is in the first through-hole and has an active surface with a connection pad and an inactive surface opposing the active surface. Another passive component is in the second through-hole. An first encapsulant covers at least portions of the core member and the passive component, and fills at least a portion of the second through-hole. A reinforcing member is on the first encapsulant. A second encapsulant covers at least a portion of the semiconductor chip, and fills at least a portion of the first through-hole. A connection member is on the core member, the active surface of the semiconductor chip, and the passive component, and includes a redistribution layer electrically connected to the connection pad and the passive component.

28 Claims, 17 Drawing Sheets

(51) Int. Cl.
*H01L 23/00* (2006.01)
*H01L 23/498* (2006.01)
*H01L 21/52* (2006.01)
*H01L 49/02* (2006.01)
*H01L 21/56* (2006.01)
*H01L 21/48* (2006.01)

(52) U.S. Cl.
CPC ........ *H01L 21/568* (2013.01); *H01L 23/3135* (2013.01); *H01L 23/49816* (2013.01); *H01L 23/49822* (2013.01); *H01L 23/49838* (2013.01); *H01L 23/562* (2013.01); *H01L 24/08* (2013.01); *H01L 24/19* (2013.01); *H01L 24/96* (2013.01); *H01L 28/40* (2013.01); *H01L 2224/04105* (2013.01); *H01L 2224/12105* (2013.01); *H01L 2224/16227* (2013.01); *H01L 2224/18* (2013.01); *H01L 2224/24195* (2013.01); *H01L 2224/32225* (2013.01); *H01L 2224/73204* (2013.01); *H01L 2224/96* (2013.01); *H01L 2924/18162* (2013.01); *H01L 2924/19105* (2013.01); *H01L 2924/3511* (2013.01); *H01L 2924/37001* (2013.01)

(58) Field of Classification Search
CPC ........... H01L 21/4857; H01L 23/49838; H01L 23/49822; H01L 23/562; H01L 23/3135; H01L 21/52; H01L 25/0655; H01L 25/0753; H01L 25/072
USPC ........................................................ 257/668
See application file for complete search history.

(56) References Cited

U.S. PATENT DOCUMENTS

| | | | |
|---|---|---|---|
| 2011/0057327 | A1 | 3/2011 | Yoshida et al. |
| 2013/0250528 | A1 | 9/2013 | Horibe |
| 2014/0252641 | A1 | 9/2014 | Lim |
| 2015/0022985 | A1* | 1/2015 | Na .................. H05K 1/183 361/763 |
| 2015/0294896 | A1* | 10/2015 | Hurwitz ............. H01L 25/00 438/15 |
| 2016/0238444 | A1 | 8/2016 | Chu et al. |
| 2016/0268214 | A1* | 9/2016 | Yu ..................... H01L 23/16 |
| 2016/0322332 | A1* | 11/2016 | Kim .................. H01L 23/16 |
| 2016/0338202 | A1 | 11/2016 | Park |
| 2017/0278766 | A1 | 9/2017 | Kim et al. |
| 2017/0287825 | A1 | 10/2017 | Lee et al. |
| 2017/0287853 | A1 | 10/2017 | Kim et al. |

FOREIGN PATENT DOCUMENTS

| | | |
|---|---|---|
| JP | WO 2012/077522 A1 | 6/2012 |
| JP | 2016-149541 A | 8/2016 |
| JP | 2017-175123 A | 9/2017 |
| JP | 2017-188645 A | 10/2017 |
| KR | 10-2017-0112363 A | 10/2017 |
| KR | 10-2017-0112906 A | 10/2017 |

OTHER PUBLICATIONS

Office Action issued in corresponding Chinese Application No. 107105047 dated Jan. 23, 2019, with English translation.
Notice of Reasons for Refusal dated Jan. 15, 2019 issued in Japanese Patent Application No. 2018-029726 (with English translation).

* cited by examiner

I–I'

FAN-OUT SEMICONDUCTOR PACKAGE MODULE

CROSS-REFERENCE TO RELATED APPLICATION

This application claims the benefit of priority to Korean Patent Application No. 10-2017-0141139, filed on Oct. 27, 2017 with the Korean Intellectual Property Office, the entirety of which is incorporated herein by reference.

BACKGROUND

The present disclosure relates to a semiconductor package module in which a semiconductor chip and a plurality of passive components are mounted on a single package to be modularized.

Increases in the size of displays for mobile devices have increased the required battery capacity. The increased battery capacity has increased the area occupied by the battery in mobile devices, which has required that the size of the printed circuit boards (PCB) be reduced. Therefore, the available mounting area for components has been reduced, such that interest in modularization has continuously increased.

An example of mounting a plurality of components of the related art may include chip on board (COB) technology. COB mounting is a scheme of mounting individual passive elements and a semiconductor package on a printed circuit board using surface-mount technology (SMT). However, in such a mounting scheme, while there is a price advantage, a large mounting area is required in order to maintain a minimum interval between components, the electromagnetic interference (EMI) between components may be high, and in particular, the distance between the semiconductor chip and the passive components is large, which may increase electric noise.

SUMMARY

An aspect of the present disclosure provides a fan-out semiconductor package module in which the mounting area for a semiconductor chip and a plurality of passive components is significantly reduced, the length of the electrical path between the semiconductor chip and a passive component is significantly reduced, a yield problem is solved, and a resin flow of an encapsulant is easily controlled, while warpage of the module is also easily controlled.

According to an aspect of the present disclosure, a plurality of passive components and a semiconductor chip may be embedded in a single package to be modularized, a passive component and a semiconductor chip may be sealed in two operations, and a reinforcing member may be introduced to some encapsulants.

According to an aspect of the present disclosure, a fan-out semiconductor package module may include a core member having a first through-hole and a second through-hole, spaced apart from each other. A semiconductor chip is in the first through-hole, and has an active surface on with a connection pad and an opposing, inactive surface. A passive component is in the second through-hole. A first encapsulant covers at least portions of the core member and the passive component, and fills at least a portion of the second through-hole. A reinforcing member is on the first encapsulant. A second encapsulant covers at least a portion of the semiconductor chip, and fills at least a portion of the first through-hole. A connection member is on the core member, the active surface of the semiconductor chip, and the passive component, and includes a redistribution layer electrically connected to the connection pad and the passive component.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
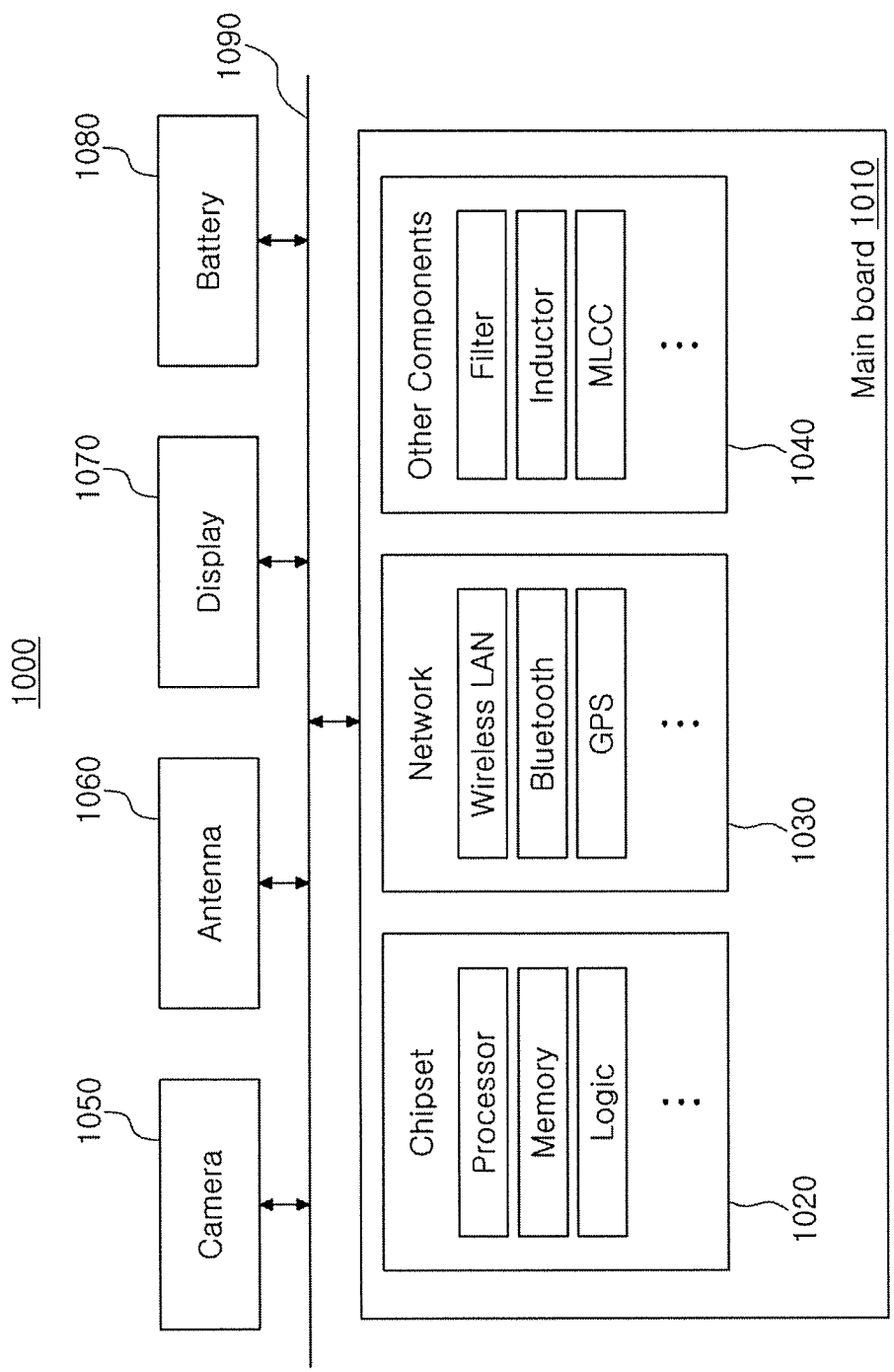
FIG. 1 is a schematic block diagram illustrating an example of an electronic device system.

Hereinafter, embodiments of the present disclosure will be described with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on', 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip, such as a volatile memory (for example, a dynamic random access memory (DRAM)), a non-volatile memory (for example, a read only memory (ROM)), a flash memory, or the like. The chip related components 1020 may also include an application processor chip such as a central processor (for example, a central processing unit (CPU)), a graphics processor (for example, a graphics processing unit (GPU)), a digital signal processor, a cryptographic processor, a microprocessor, a microcontroller, or the like. The chip related components 1020 may additionally include a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, or other components not illustrated, including an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
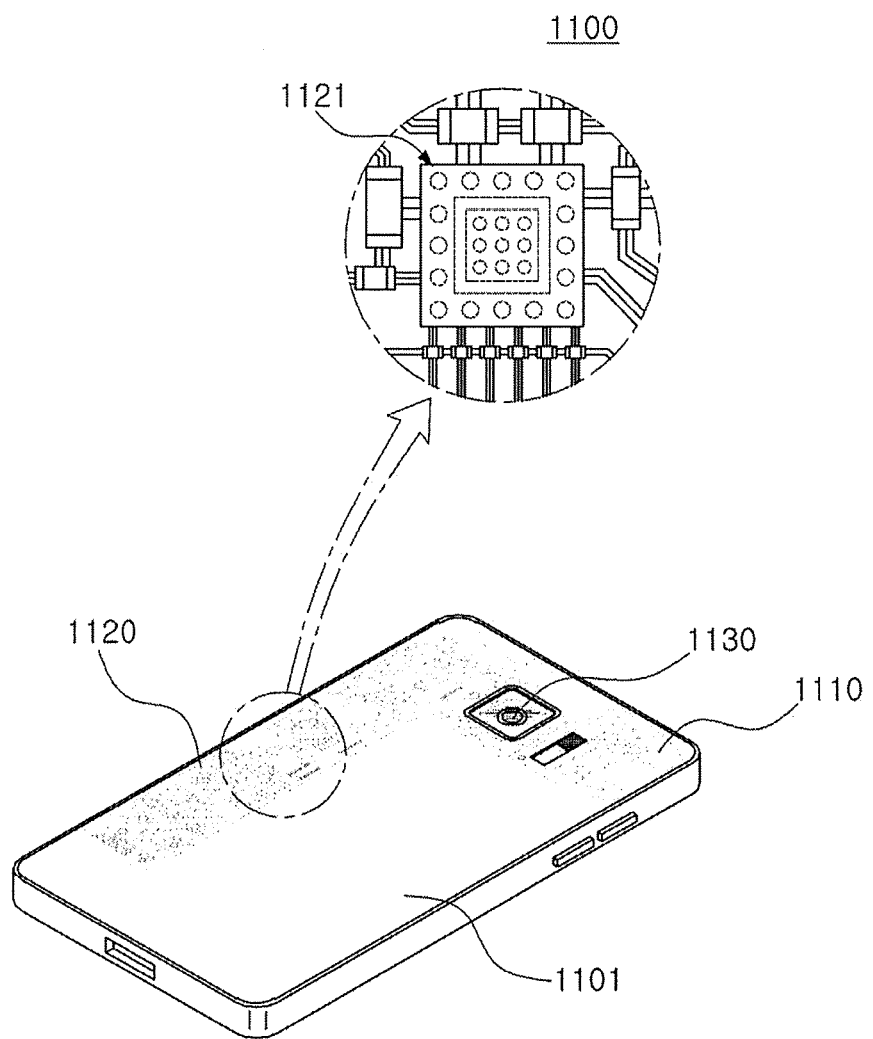
FIG. 2 is a schematic perspective view illustrating an example of an electronic device.

FIG. 2 is a schematic perspective view illustrating an example of an electronic device.

Referring to FIG. 2, a semiconductor package may be used for various purposes in electronic devices 1000 as described above. For example, a mother board 1110 may be accommodated in a body 1101 of a smartphone 1100, and various electronic components 1120 may be physically or electrically connected to the mother board 1110. Other components that may or may not be physically or electrically connected to the main board 1010, such as a camera module 1130, may be accommodated in the body 1101. Some of the electronic components 1120 may be the chip related components, for example, the semiconductor package 1121, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may be damaged due to external physical or chemical impacts and may not serve as a finished semiconductor product itself. Rather, the semiconductor chip is packaged and used in an electronic device, or the like, in a packaged state.

Semiconductor packaging may be required as there may be a difference in a circuit width between the semiconductor chip and a main board of the electronic device in terms of electrical connection. The size of connection pads of the semiconductor chip and the interval between the connection pads of the semiconductor chip are very fine, whereas the size of component mounting pads of the main board used in the electronic device and the interval between the component mounting pads of the main board are significantly larger than those of the semiconductor chip. Therefore, it may be difficult to directly mount the semiconductor chip on the main board, and packaging technology may be required for buffering the difference in circuit width between the semiconductor and the main board.

A semiconductor package manufactured by the packaging technology may be classified as a fan-in semiconductor package or a fan-out semiconductor package depending on its structure and purpose.

The fan-in semiconductor package and the fan-out semiconductor package will hereinafter be described in more detail with reference to the drawings.

Fan-In Semiconductor Package

Figure 3:
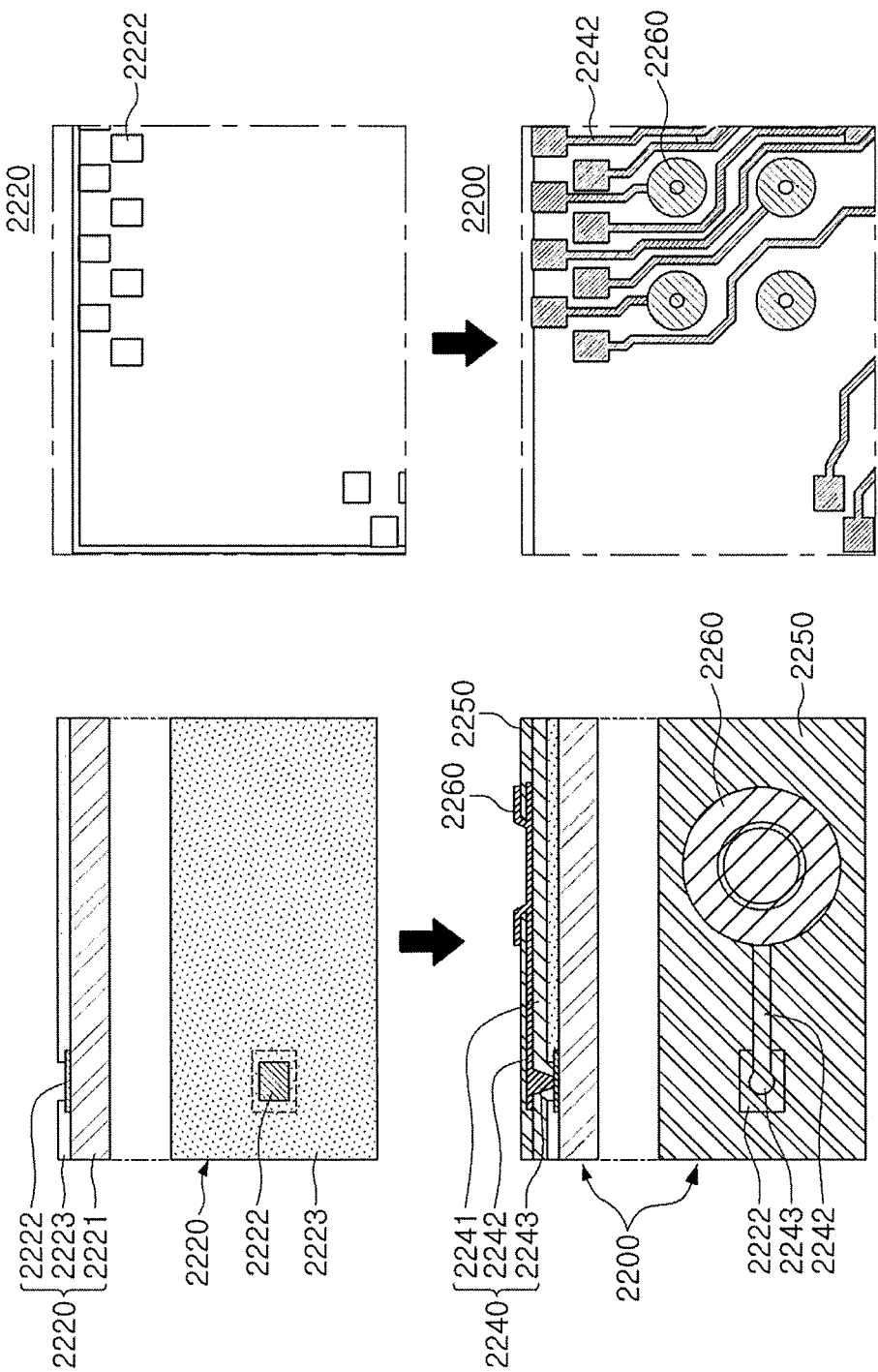
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
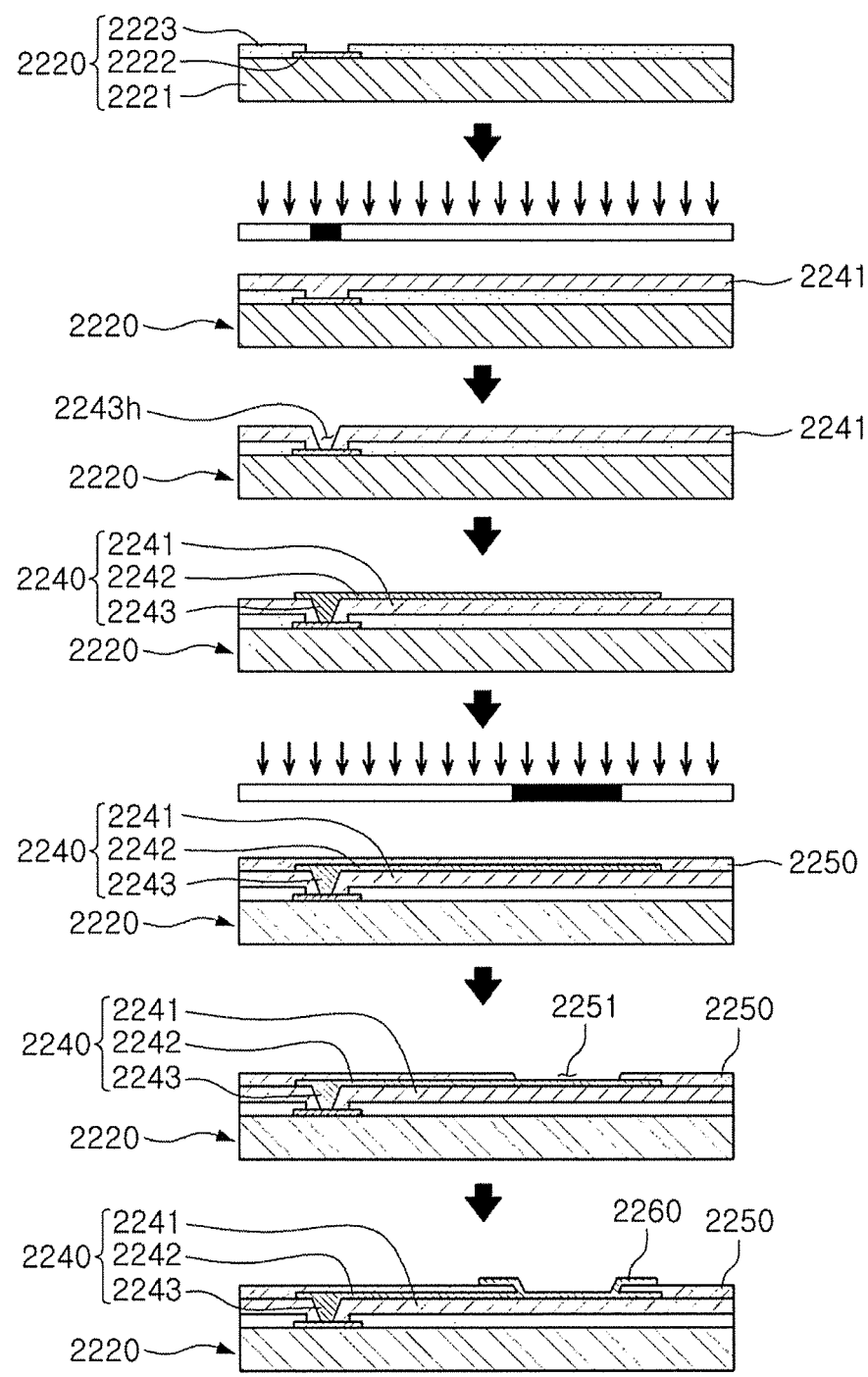
FIG. 4 is schematic cross-sectional views illustrating a packaging process of a fan-in semiconductor package.

FIG. 4 includes schematic cross-sectional views illustrating a packaging process of a fan-in semiconductor package.

Referring to the drawings, a semiconductor chip 2220 may be, for example, an integrated circuit (IC) in a bare state, including a body 2221, including silicon (Si), germanium (Ge), gallium arsenide (GaAs), or the like, connection pads 2222 formed on one surface of the body 2221, including a conductive material such as aluminum (Al), or the like, and a passivation layer 2223, such as an oxide film, a nitride film, or the like, formed on one surface of the body 2221 and covering at least portions of the connection pads 2222. Since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on the size of the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243$h$ opening to the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. A fan-in semiconductor package 2200 including, for example, the semiconductor chip 2220, the connection member 2240, the passivation layer 2250, and the underbump metal layer 2260 may thus be manufactured through a series of steps.

As described above, the fan-in semiconductor package may have a package form in which all of the connection pads, for example, input/output (I/O) terminals, of the semiconductor chip are disposed inside the semiconductor chip, may have excellent electrical characteristics, and may be produced at low cost. As a result, many elements mounted in smartphones have been manufactured in a fan-in semiconductor package form and developed to implement a rapid signal transfer while having a compact size.

However, since all I/O terminals need to be disposed inside the semiconductor chip in the fan-in semiconductor package, the fan-in semiconductor package has a large spatial limitation. It is difficult to apply this structure to a semiconductor chip having a large number of I/O terminals or a semiconductor chip having a small size. In addition, due to the disadvantage described above, the fan-in semiconductor package may not be directly mounted and used on the main board of the electronic device. The reason is that even when the size of the I/O terminals of the semiconductor chip and the interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
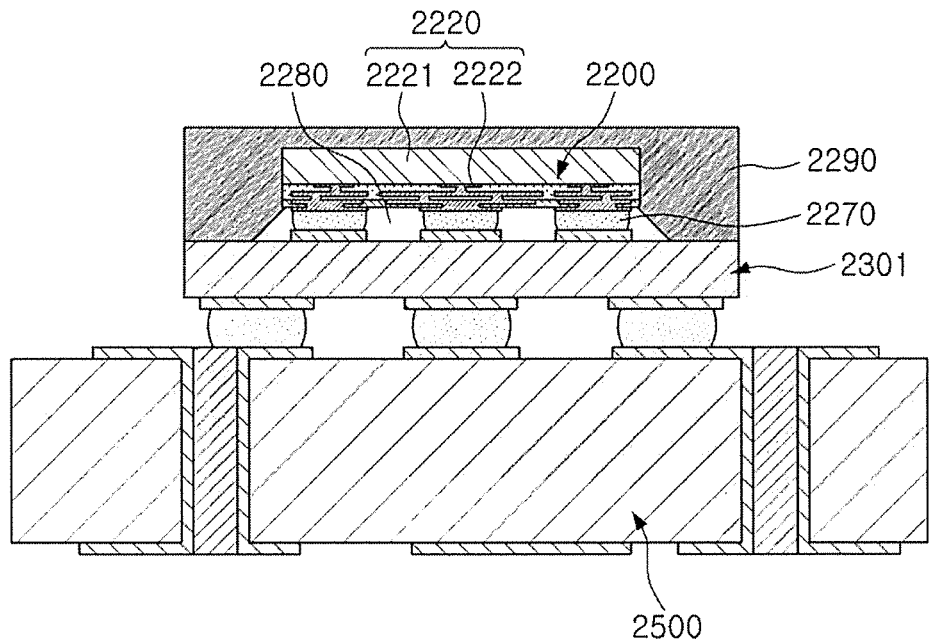
FIG. 5 is a schematic cross-sectional view illustrating a case in which a fan-in semiconductor package is mounted on a printed circuit board and is ultimately mounted on a main board of an electronic device.

FIG. 5 is a schematic cross-sectional view illustrating a fan-in semiconductor package mounted on a printed circuit board and ultimately mounted on a main board of an electronic device.

Figure 6:
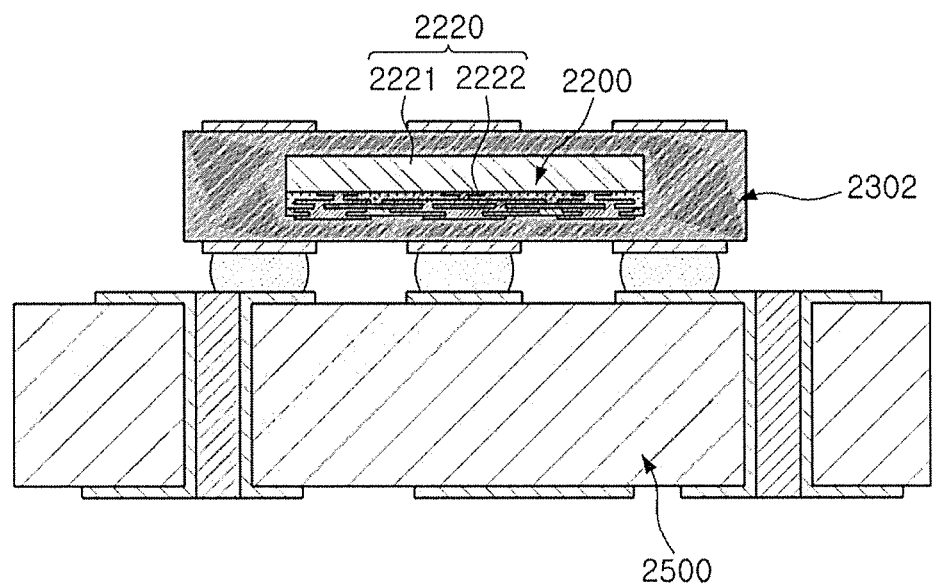
FIG. 6 is a schematic cross-sectional view illustrating a case in which a fan-in semiconductor package is embedded in a printed circuit board and is ultimately mounted on a main board of an electronic device.

FIG. 6 is a schematic cross-sectional view illustrating a fan-in semiconductor package embedded in a printed circuit board and ultimately mounted on a main board of an electronic device.

Referring to the drawings, in a fan-in semiconductor package 2200, connection pads 2222, that is, I/O terminals, of the semiconductor chip 2220 may be redistributed once more through a printed circuit board 2301. The fan-in semiconductor package 2200 may ultimately be mounted on a main board 2500 of an electronic device where it is mounted on the printed circuit board 2301. Solder balls 2270, and the like, may be fixed by an underfill resin 2280, or the like, and an outer surface of the semiconductor chip 2220 may be covered with a molding material 2290, or the like. Alternatively, a fan-in semiconductor package 2200 may be embedded in a separate printed circuit board 2302. Connection pads 2222, that is, I/O terminals, of the semiconductor chip 2220 may be redistributed once more by the printed circuit board 2302 where the fan-in semiconductor package 2200 is embedded in the printed circuit board 2302, and the fan-in semiconductor package 2200 may ultimately be mounted on a main board 2500 of an electronic device.

As described above, it may be difficult to directly mount and use the fan-in semiconductor package on the main board of the electronic device. Therefore, the fan-in semiconductor package may be mounted on the separate printed circuit board and may then be mounted on the main board of the electronic device through a packaging process or may be mounted and used on the main board of the electronic device where it is embedded in the printed circuit board.

Fan-Out Semiconductor Package

Figure 7:
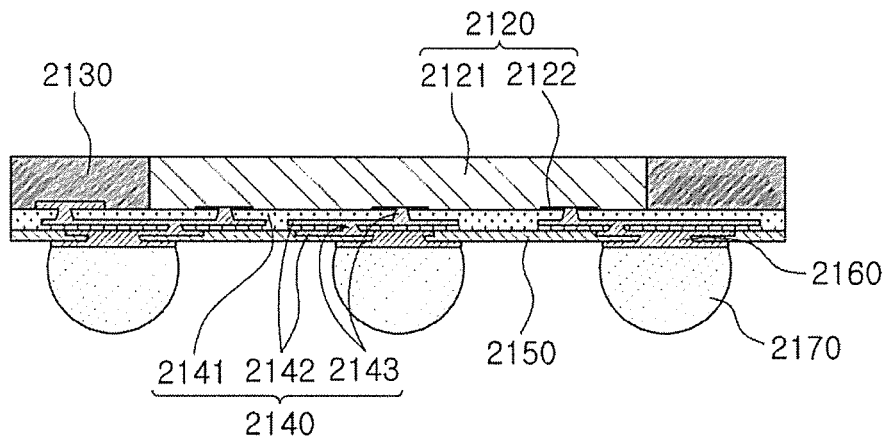
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer 123, and the like. The connection member 2140 may include an insulating layer 2141, redistribution layers 2142 formed on the insulating layer 2141, and vias 2143 electrically connecting the connection pads 2122 and the redistribution layers 2142 to each other.

The fan-out semiconductor package may have a form in which I/O terminals of the semiconductor chip are redistributed and disposed outwardly of the semiconductor chip through the connection member formed on the semiconductor chip. In the fan-in semiconductor package, all I/O terminals of the semiconductor chip need to be disposed inside the semiconductor chip. Therefore, when the size of the semiconductor chip is decreased, the size and pitch of the balls need to be decreased, such that a standardized ball layout may not be used in the fan-in semiconductor package. On the other hand, the fan-out semiconductor package has a form in which the I/O terminals of the semiconductor chip are redistributed and disposed outwardly of the semiconductor chip through the connection member formed on the semiconductor chip as described above. Therefore, even where the size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
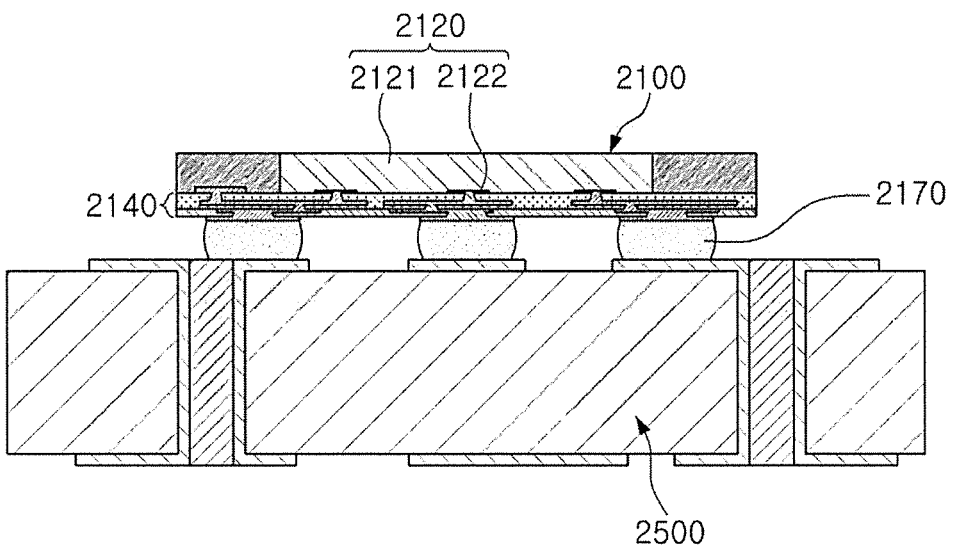
FIG. 8 is a schematic cross-sectional view illustrating a case in which a fan-out semiconductor package is mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. As described above, the fan-out semiconductor package 2100 includes the connection member 2140 formed on the semiconductor chip 2120 and capable of redistributing the connection pads 2122 to a fan-out region that is outside of an area of the semiconductor chip 2120, such that the standardized ball layout may be used in the fan-out semiconductor package 2100 as it is. As a result, the fan-out semiconductor package 2100 may be mounted on the main board 2500 of the electronic device without using a separate printed circuit board, or the like.

Since the fan-out semiconductor package may be mounted on the main board of the electronic device without using the separate printed circuit board, the fan-out semiconductor package may be implemented at a smaller thickness than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Semiconductor Package Module

Figure 9:
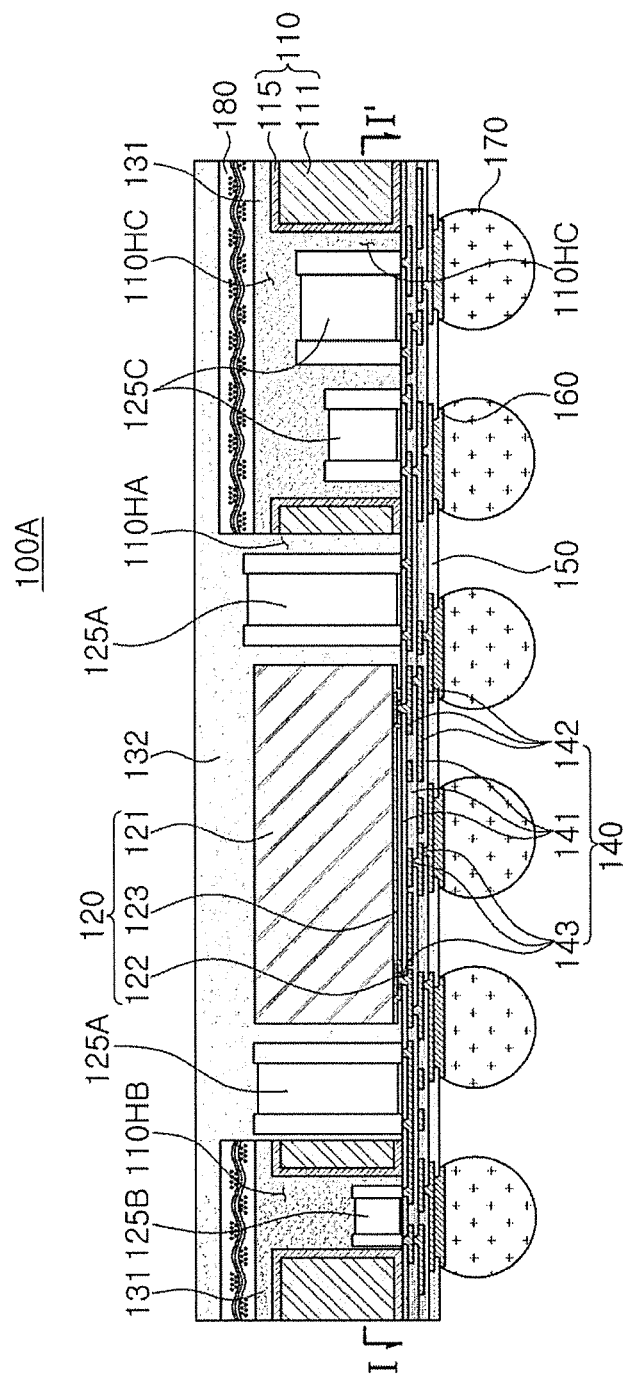
FIG. 9 is a schematic perspective view illustrating an exemplary fan-out semiconductor package module according to the present disclosure.

FIG. 9 is a schematic cross-sectional view illustrating an exemplary fan-out semiconductor package module of the present disclosure.

Figure 10:
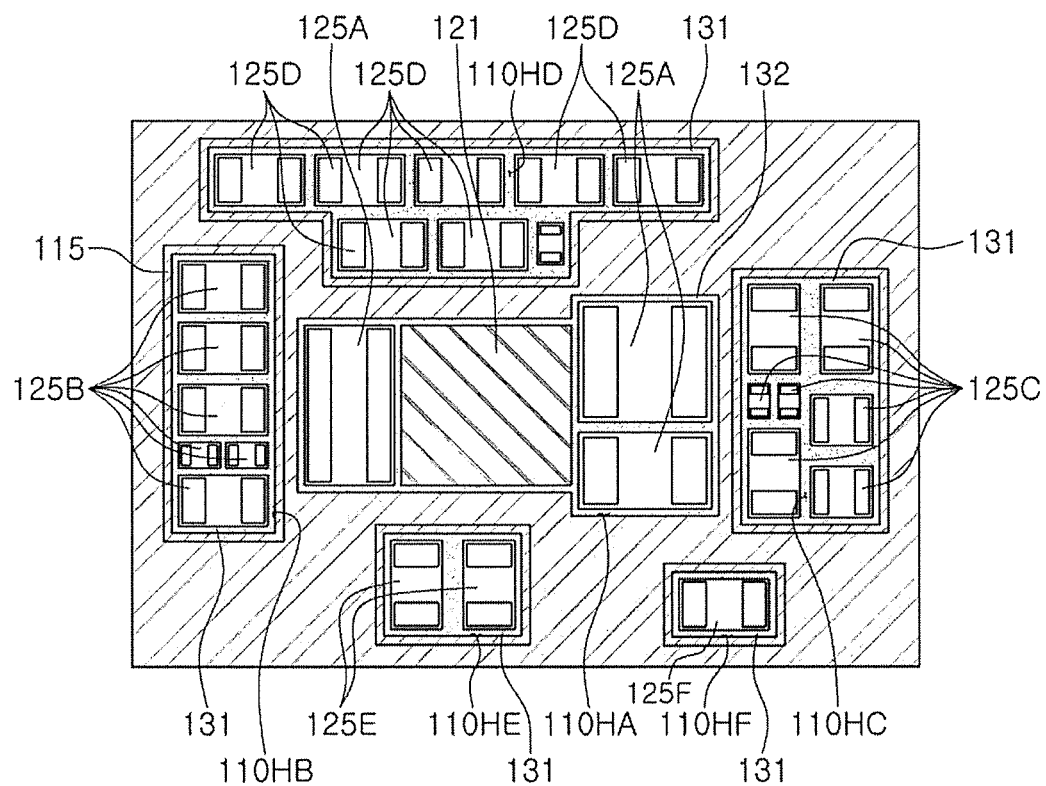
FIG. 10 is a schematic plan view taken along line I-I' of the fan-out semiconductor package module of FIG. 9.

FIG. 10 is a schematic plan view taken along line I-I' of the semiconductor package of FIG. 9.

Referring to FIGS. 9 and 10, a fan-out semiconductor package module 100A according to the present exemplary embodiment may include a core member 110 having first to sixth through-holes 110HA, 110HB, 110HC, 110HD, 110HE, and 110HF. A semiconductor chip 120 is in the first through-hole 110HA and has an active surface with a connection pad 122 and an inactive surface opposing the active surface. There is at least one passive component 125A located side-by-side with the semiconductor chip 120 in the first through-hole 110HA. There is also at least one passive component in the second through sixth through-holes. In FIG. 10, five passive components 125B are located in the second through-hole 110HB, seven passive components 125C are located in the third through-hole 110HC, eight passive components 125D are located in the fourth through-hole 110HD, two passive components 125E are located in the fifth through-hole 110HE, and one passive component 125F is located in the sixth through-hole 110HF. A first encapsulant 131 covers at least portions of the core member 110 and the passive components 125B, 125C, 125D, 125E, and 125F, and fills at least portions of the second to sixth through-holes 110HB, 110HC, 110HD, 110HE, and 110HF. A reinforcing member 180 is on the first encapsulant 131. A second encapsulant 132 the semiconductor chip 120 and the passive component 125A, and fills the first through-hole 110HA. A connection member 140 is on the core member 110, the active surface of the semiconductor chip 120, and the passive components 125A, 125B, 125C, 125D, 125E, and 125F. The connection member 140 includes a redistribution layer 142 electrically connected to the connection pad 122, the passive components 125A, 125B, 125C, 125D, 125E, and 125F. A passivation layer 150 is on the connection member 140. An underbump metal layer 160 is in an opening of the passivation layer 150 and is electrically connected to the redistribution layer 142. An electrical connection structure 170 is on the underbump metal layer 160 and is electrically connected to the redistribution layer 142 through the underbump metal layer 160.

In the fan-out semiconductor package module 100A according to the present exemplary embodiment, a plurality of passive components 125A, 125B, 125C, 125D, 125E, and 125F are located in a single package with the semiconductor chip 120 to be modularized. Thus, the distance between components may be significantly reduced, so that the mounting area in a printed circuit board, such as a motherboard and the like, may be significantly reduced. Moreover, the electrical path between the semiconductor chip 120 and each of the passive components 125A, 125B, 125C, 125D, 125E, and 125F is significantly reduced, so noise may be reduced. Through two or more sealing operations rather than a single sealing operation, the passive components 125B, 125C, 125D, 125E, and 125F are sealed separately from the semiconductor chip 120 and are mounted such that foreign body influence, or the like, of the semiconductor chip 120 may be significantly reduced.

In the fan-out semiconductor package module 100A according to the present exemplary embodiment, a two-step sealing operation using the reinforcing member 180 is performed. The passive components 125B, 125C, 125D, 125E, and 125F with relatively smaller thicknesses are initially disposed in the second to sixth through-holes 110HB, 110HC, 110HD, 110HE, and 110HF, respectively, and are sealed by the first encapsulant 131. Thereafter, the passive component 125A with a relatively larger thickness is disposed in the first through-hole 110HA with the semiconductor chip 120 and is sealed by the second encapsulant 132. As such, the thickness of the core member 110 can be reduced. Thus, the absolute quantity of resin for the first encapsulant 131, which seals the passive components 125B, 125C, 125D, 125E, and 125F, is reduced. As a result, the resin flow may be controlled, to address a problem where a mounting defect, such as a fly defect, affects the passive components 125B, 125C, 125D, 125E, and 125F and causes an electrode pad of the passive component to become separated from the connection member 140. In addition, the thickness of the first encapsulant 131 is reduced, so that the thickness of the entirety of the fan-out semiconductor package module 100A is also reduced. Despite the fact that the thickness of the first encapsulant 131 is reduced, rigidity may nevertheless be maintained by means of the reinforcing member 180, so warpage may be also controlled. When the thickness of the core member 110 is reduced, impacts with the core member 110 of a nozzle when the passive components 125B, 125C, 125D, 125E, and 125F are mounted may be reduced.

Hereinafter, respective components included in the fan-out semiconductor package module 100A according to the present exemplary embodiment will be described in further detail.

The core member 110 may improve rigidity of the fan-out semiconductor package module 100A depending on its materials, and may serve to secure uniformity of the thickness of the first and second encapsulants 131 and 132. The core member 110 may have a plurality of through-holes 110HA, 110HB, 110HC, 110HD, 110HE, and 110HF, which may be physically spaced apart from each other. The semiconductor chip 120 and the plurality of passive components 125A, 125B, 125C, 125D, 125E, and 125F may be disposed in the plurality of through-holes 110HA, 110HB, 110HC, 110HD, 110HE, and 110HF, respectively. The semiconductor chip 120 and the plurality of passive components 125A, 125B, 125C, 125D, 125E, and 125F may be spaced apart from walls of the plurality of through-holes 110HA, 110HB, 110HC, 110HD, 110HE, and 110HF, respectively, by predetermined distances, and may be surrounded by the walls of the plurality of through-holes 110HA, 110HB, 110HC, 110HD, 110HE, and 110HF. The core member 110 may be modified, if necessary, and the thickness of the core member 110 may be relatively smaller than that of the semiconductor chip 120. For example, the thickness of the core member 110 may be 0.5 times the thickness ("T") of the semiconductor package, or less, but the thickness thereof is not limited thereto.

The core member 110 may include an insulating layer 111. The material of the insulating layer 111 is not particularly limited. An insulating material may be used as the material of the insulating layer 111, and may be, for example, a thermosetting resin such as an epoxy resin, a thermoplastic resin such as a polyimide resin, a resin in which the thermosetting resin or the thermoplastic resin is impregnated, together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material. The core member 110 may have a good elastic modulus, as compared to the first encapsulant 131, so as to maintain rigidity. The insulating layer 111 of the core member 110 may be, for example, prepreg, including a glass fiber, an inorganic filler, and an insulating resin, while the first encapsulant 131 may be, for example, ABF, including an inorganic filler and an insulating resin, but the insulating layer and the first encapsulant are not limited thereto.

Metal layers 115 may be formed in respective walls of each of the second to sixth through-holes 110HB, 110HC, 110HD, 110HE, and 110HF. The metal layer 115 may be disposed to be extended to an upper surface and a lower surface of the core member 110. The metal layer 115 may provide electromagnetic shielding and heat dissipation effects. The metal layer 115 may be a conductive material such as copper (Cu), aluminum (Al), silver (Ag), tin (Sn), gold (Au), nickel (Ni), lead (Pb), titanium (Ti), or alloys thereof, but the material thereof is not limited thereto.

The semiconductor chip 120 may be an integrated circuit (IC) provided in an amount of several hundreds to several millions of elements or more integrated in a single chip. The integrated circuit may be, for example, a power management IC (PMIC), but is not limited thereto. The semiconductor chip 120 may be an integrated circuit in a bare state where a separate bump or redistribution layer is not formed. In this case, the semiconductor chip 120 may physically be in contact with a via 143 of the connection member 140. The integrated circuit may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. The material of each of the connection pads 122 may be a conductive material such as aluminum (Al), or the like. A passivation layer 123 exposing the connection pads 122 may be formed on the body 121, and the passivation layer 123 may be an oxide film, a nitride film, or the like, or a double layer of an oxide layer and a nitride layer. An insulating layer (not illustrated), or the like, may be further disposed in other required positions.

The passive components 125A, 125B, 125C, 12510, 125E, and 125F may be multilayer ceramic capacitors (MLCCs), low inductance chip capacitors (LICC), power inductors, beads, or the like, respectively. The respective passive components 125A, 125B, 125C, 125D, 125E, and 125F may have different thicknesses. In addition, the respective passive components 125A, 125B, 125C, 125D, 125E, and 125F may have a thickness different from that of the semiconductor chip 120. A passive component having relatively small thicknesses, for example, the passive components 125B, 125C, 125D, 125E, and 125F may have a thickness of 0.5 T or less, are respectively disposed in the second to sixth through-holes 110HB, 110HC, 110HD, 110HE, and 110HF, in which the semiconductor chip 120 is not disposed. A passive component having a relatively large thickness, for example, the passive component 125A having a thickness of 0.7 T or less, is disposed in the first through-hole 110HA in which the semiconductor chip 120 is disposed. In the fan-out semiconductor package module 100A according to the present exemplary embodiment, passive components are sealed in two or more operations as described above, so various defects, caused by a variation in thickness as described above, may be reduced. The number of respective passive components 125A, 125B, 125C, 125D, 125E, and 125F is not particularly limited, and may be greater or less than the number of those illustrated in the drawings. In each of the passive components 125A, 125B, 125C, 125D, 125E, and 125F, an electrode pad may be physically in contact with the via 143 of the connection member 140, and may be electrically connected to the connection pad 122 of the semiconductor chip 120 through the redistribution layer 142.

The first encapsulant 131 may cover at least portions of the core member 110 and the passive components 125B, 125C, 125D, 125E, and 125F. Moreover, the first encapsulant 131 may fill at least portions of the second to sixth through-holes 110HB, 110HC, 110HD, 110HE, and 110HF. The first encapsulant 131 may include an insulating material, which may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as prepreg, ABF, FR-4, BT, or the like. Known molding materials such as an epoxy molding compound (EMC), or the like, may be used, and a photosensitive material, that is, a photoimagable encapsulant (PIE) may be used, if necessary. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material.

The second encapsulant 132 may cover at least portions of the semiconductor chip 120 and the passive component 125A. The second encapsulant 132 may fill at least a portion of the first through-hole 110HA. The second encapsulant 132 may cover at least a portion of the reinforcing member 180. The second encapsulant 132 may also include an insulating material, which may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as prepreg, ABF, FR-4, BT, or the like. In addition, the material such as EMC, PIE, or the like, may be used, if necessary. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material.

The first encapsulant 131 and the second encapsulant 132 may include the same material or may include different materials. Even when the first encapsulant 131 and the second encapsulant 132 include the same material, a boundary therebetween may be identifiable. The first encapsulant 131 and the second encapsulant 132 may include similar materials, but may have different colors. For example, the first encapsulant 131 may be more transparent than the second encapsulant 132. In other words, the boundary therebetween may be clear. In the alternative, the boundary between the first and second encapsulant 131 and 132 may not be visible. However, the existence of two encapsulants may still be established by other indicators in view of an understanding of the underlying manufacturing processes for semiconductor package modules.

The connection member 140 may allow the connection pad 122 of the semiconductor chip 120 to be redistributed. The connection member 140 may allow the semiconductor chip 120 and the passive components 125A, 125B, 125C, 125D, 125E, and 125F to be electrically connected to each other. Several tens to several millions of connection pads 122 having various functions may be redistributed by the connection member 140, and may be physically or electrically externally connected through the electrical connection structures 170 depending on the functions. The connection member 140 may include insulating layers 141, redistribution layers 142 disposed on the insulating layers 141, and vias 143 penetrating through the insulating layers 141 and connecting the redistribution layers 142 to each other. The connection member 140 may be formed of a single layer, or may be formed of a number of layers greater than that illustrated in the drawings.

The material of each of the insulating layers 141 may be an insulating material. A photosensitive insulating material such as a PID resin may also be used as the insulating material. That is, the insulating layer 141 may be a photosensitive insulating layer. When the insulating layer 141 has photosensitive properties, the insulating layer 141 may be formed to have a reduced thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are multiple layers, the insulating layers 141 may be integrated with each other depending on a process, such that a boundary therebetween may also not be apparent.

The redistribution layers 142 may serve to substantially redistribute the connection pads 120P. The redistribution layers 142 may include, for example, a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of layers corresponding thereto. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

The vias 143 may allow the redistribution layers 142, the connection pads 122, the passive components 125A, 125B, 125C, 125D, 125E, and 125F, and the like, formed in different layers, to be electrically connected to each other, resulting in formation of an electrical path in the fan-out semiconductor package module 100A. The vias 143 may be physically in contact with the connection pad 122 and respective electrode pads of the passive components 125A, 125B, 125C, 125D, 125E, and 125F. In other words, the semiconductor chip 120 may be directly connected to the via 143 of the connection member 140 without a separate bump in the form of a bare die, and the passive components 125A, 125B, 125C, 125D, 125E, and 125F may be directly connected to the via 143 of the connection member 140 while a surface-mount type package, using a solder bump, or the like, is an embedded type package. However, if necessary, the passive components 125A, 125B, 125C, 125D, 125E, and 125F may be a normal type rather than an embedded type. In this case, the passive components may be mounted using a solder bump, or the like. The material of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be entirely filled with the conductive material, or the conductive material may be formed along a wall of each of the vias. The vias 143 may have any acceptable shape, such as a tapered shape, a cylindrical shape, or the like.

The passivation layer 150 may protect the connection member 140 from external physical or chemical damage. The passivation layer 150 may have openings exposing at least portions of the redistribution layer 142 of the connection member 140. The number of openings formed in the passivation layer 150 may be several tens to several thousands. The passivation layer 150 may include an insulating resin and an inorganic filler, but may omit a glass fiber. For example, the passivation layer 150 may be formed of ABF, but is not limited thereto.

The underbump metal layer 160 may improve connection reliability of the electronic connection structures 170, resulting in improvement of board level reliability of the semiconductor package 100. The underbump metal layer 160 may be connected to the redistribution layer 142 of the connection member 140 exposed through the openings of the passivation layer 150. The underbump metal layer 160 may be formed in the openings of the passivation layer 150 by the known metallization method using the known conductive material such as a metal, but is not limited thereto.

The electrical connection structures 170 may be additionally configured to physically or electrically externally connect the semiconductor package module 100A. For example, the semiconductor package module 100A may be mounted on the main board of the electronic device through the electrical connection structures 170. Each of the electrical connection structures 170 may be formed of a conductive material such as a solder, or the like, by way of example, but the material of the electrical connection structures is not limited thereto. Each of the electrical connection structures 170 may be a land, a ball, a pin, or the like. The electrical connection structures 170 may be formed as a multilayer or a single layer structure. When the electrical connection structures 170 are formed as multilayer structures, the electrical connection structures 170 may include a copper (Cu) pillar and a solder. When the electrical connection structures 170 are formed as a single layer structure, the electrical connection structures 170 may include a tin-silver solder or copper (Cu). However, the electrical connection structures 170 are not limited thereto. The number, interval, disposition form, and the like, of electrical connection structures 170 are not particularly limited, and may be deformed according to the design specifications by those skilled in the art. For example, the electrical connection structures 170 may be provided in an amount of several tens to several thousands according to the number of connection pads 122, or may be provided in an amount of several tens to several thousands or more or several tens to several thousands or less.

At least one of the electrical connection structures 170 may be disposed in a fan-out region. The fan-out region refers to a region other than the region in which the semiconductor chip 120 is disposed. A fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a reduced thickness and its price competitiveness may be excellent.

The reinforcing member 180 may allow a thickness of the first encapsulant 131 to be relatively low, and may reinforce rigidity of the fan-out semiconductor package module 100A. The reinforcing member 180 may be introduced using an unclad copper clad laminate (unclad CCL), but is not limited thereto. The reinforcing member 180 may have a greater elastic modulus as compared to the first encapsulant 131 so as to maintain rigidity. For example, the reinforcing member 180 may be, for example, prepreg, including a glass fiber, an inorganic filler, and an insulating resin, while the first encapsulant 131 may be, for example, ABF, including an inorganic filler and an insulating resin, but the reinforcing member 180 and the first encapsulant 131 are not limited thereto. The reinforcing member 180 is disposed on the first encapsulant 131, and may be penetrated by the first through-hole 110HA in a similar manner to the first encapsulant 131.

Figure 11:
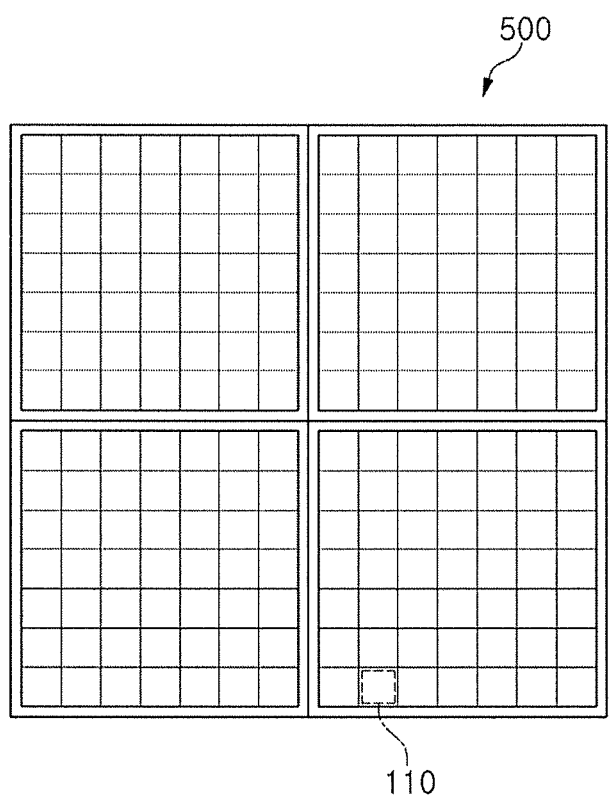
FIG. 11 is a schematic cross-sectional view illustrating an example of a panel used in the fan-out semiconductor package module of FIG. 9.

FIG. 11 is a schematic cross-sectional view illustrating an example of a panel used in the fan-out semiconductor package module of FIG. 9.

Referring to FIG. 11, the fan-out semiconductor package module 100A according to the present exemplary embodiment may be manufactured using a panel 500 having a large size. The size of the panel 500 may be two times to four times or more the size of a wafer according to the related art, so that a greater number of fan-out semiconductor package modules 100A may be manufactured through a single process. In other words, productivity may be significantly increased. In detail, as the size of each of the package fan-out semiconductor package modules 100A is increased, relative productivity may be increased as compared to when a wafer is used. Each unit portion of the panel 500 may be a core member 110, first prepared in a manufacturing method which will be described later. After a plurality of fan-out semiconductor package modules 100A are manufactured at the same time using a single process using the panel 500 described above, the plurality of fan-out semiconductor package modules 100A are cut using a known cutting process, for example, a dicing process, so respective fan-out semiconductor package modules 100A may be obtained.

FIGS. 12A through 12D are cross-sectional schematic views illustrating an exemplary method of manufacturing the fan-out semiconductor package module illustrated in FIG. 9.

Figure 12A:
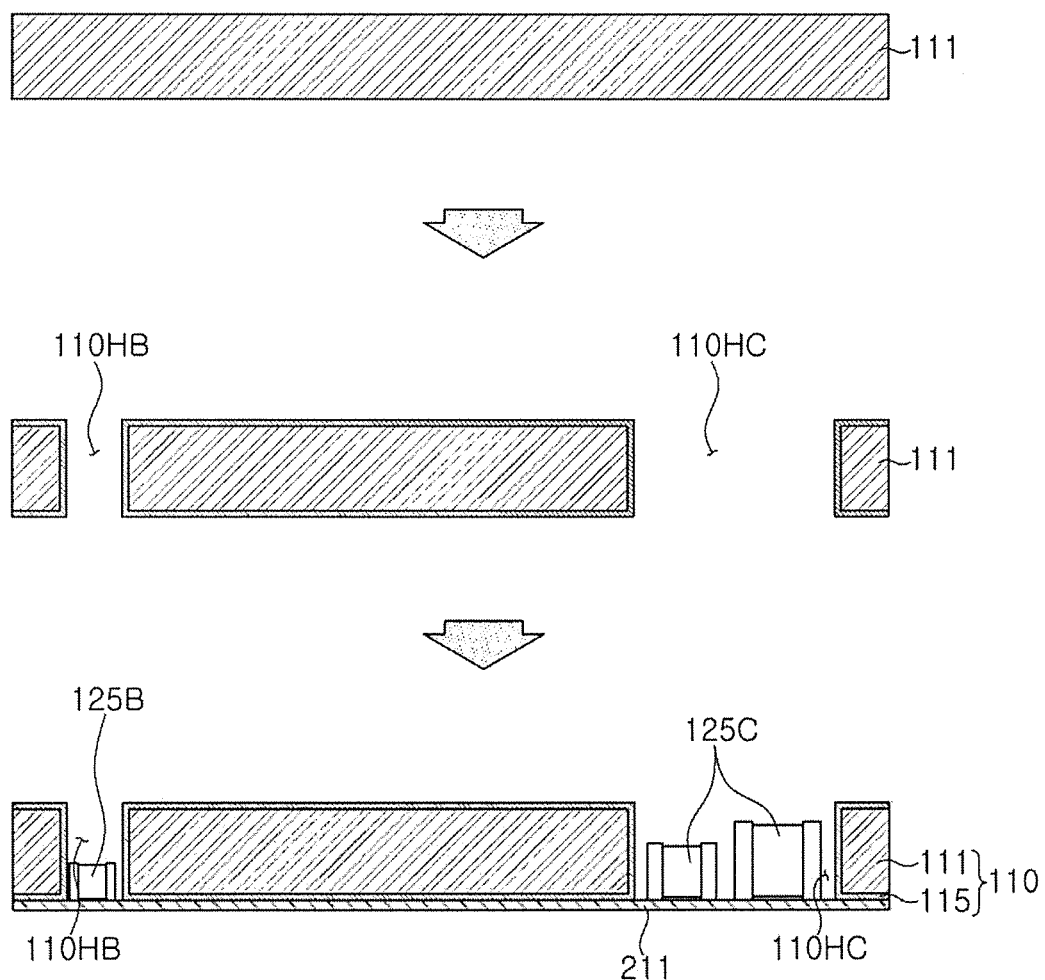
FIGS. 12A through 12D are schematic cross-sectional views illustrating an exemplary manufacturing method for the fan-out semiconductor package module of FIG. 9.

FIG. 12A illustrates the preparation of the core member 110. The core member 110 may be provided as a copper clad laminate (CCL) introduced to the panel 500 described above. Next, through-holes 110HB, 110HC, 110HD, 110HE, and 110HF may be formed in the core member 110. In the cross-sectional view of the drawings, only the second and third through-holes 110HB 110HC are illustrated. However, fourth through sixth through-holes 110HD, 100HE, and 110HF may be also formed, as well as more or fewer through holes. The through-holes 110HB, 110HC, 110HD, 110HE, and 110HF may be formed by a laser drill and/or a mechanical drill depending on the material of the insulating layer 111. A sand blasting or chemical etching method may be used. In addition, a metal layer 125 may be formed through a plating process in which a copper foil of a copper clad laminate is used as a seed layer. A first adhesive film 211 may be attached to a lower surface of the core member 110, and passive components 125B, 125C, 125D, 125E, and 125F may be disposed in through-holes 110HB, 110HC, 110HD, 110HE, and 110HF, respectively. The first adhesive film 211 may be a known tape, but the first adhesive film is not limited thereto.

Figure 12B:
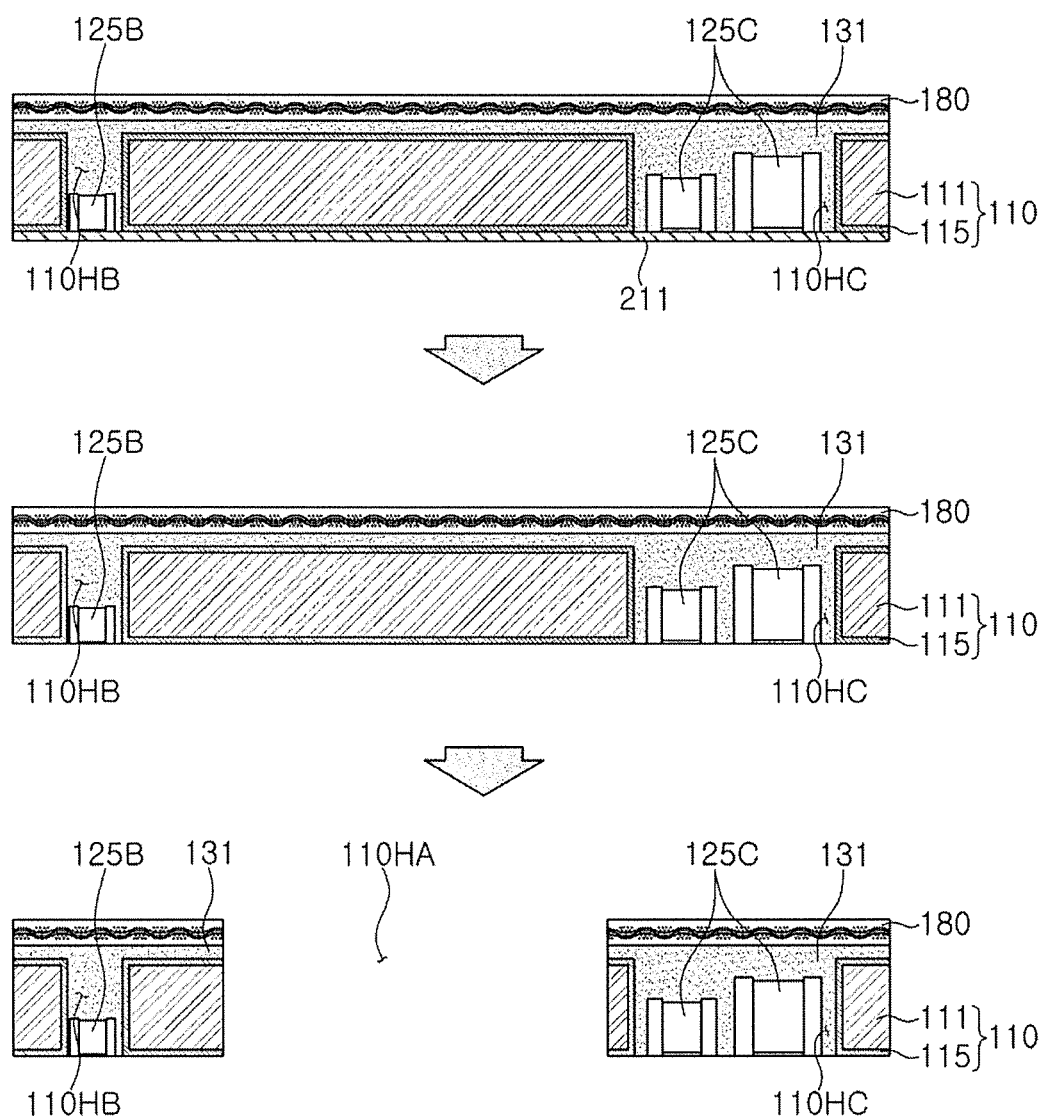

FIG. 12B illustrates the first encapsulant 131 being formed so that the core member 110 and the passive components 125B, 125C, 125D, 125E, and 125F are sealed. The first encapsulant 131 may be formed using a method in which an uncured film is laminated and is then cured, or may be formed using a method in which a liquid material is applied and is then cured. Moreover, an unclad copper clad laminate (unclad CCL) or the like is laminated on the first encapsulant 131 to introduce the reinforcing member 180. The first adhesive film 211 may then be removed. The first adhesive film 211 may be detached by a mechanical method. A through-hole 110HA may then be formed in the core member 110. The through-hole 110HA may be formed by a laser drill and/or a mechanical drill depending on a material of the insulating layer 111. A sand blasting or chemical etching method may be used. During the formation of the through-hole 110HA, the first encapsulant 131 and the reinforcing member 180 are also penetrated.

Figure 12C:
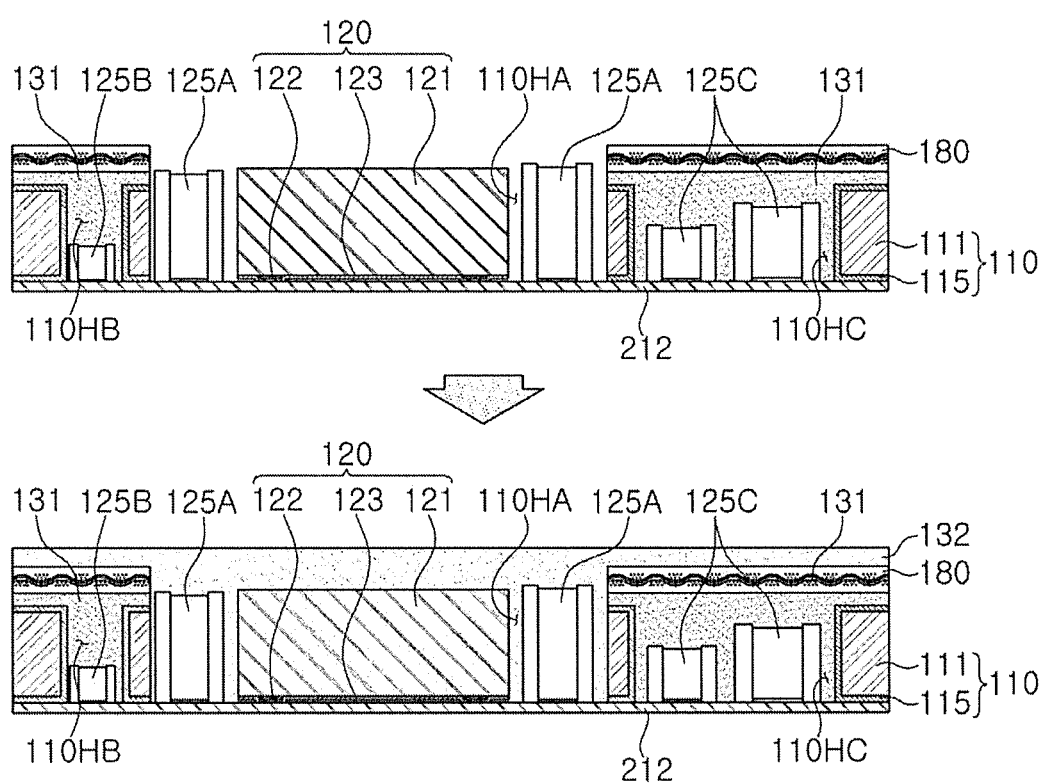

Referring to FIG. 12C, a second adhesive film 212 is attached to a lower surface of the core member 110. The semiconductor chip 120 and a passive component 125A are disposed in the through-hole 110HA. The semiconductor chip 120 may be disposed in the face-down form. The second adhesive film 212 is also a known type of tape, but the second adhesive film is not limited thereto. The second encapsulant 132 is formed, so that the semiconductor chip 120 and the passive component 125A are sealed. The reinforcing member 180 may also covered with the second encapsulant 132. The second encapsulant 132 may be formed using a method in which an uncured film is laminated and is then cured, or may be formed using a method in which a liquid material is applied and is then cured.

Figure 12D:
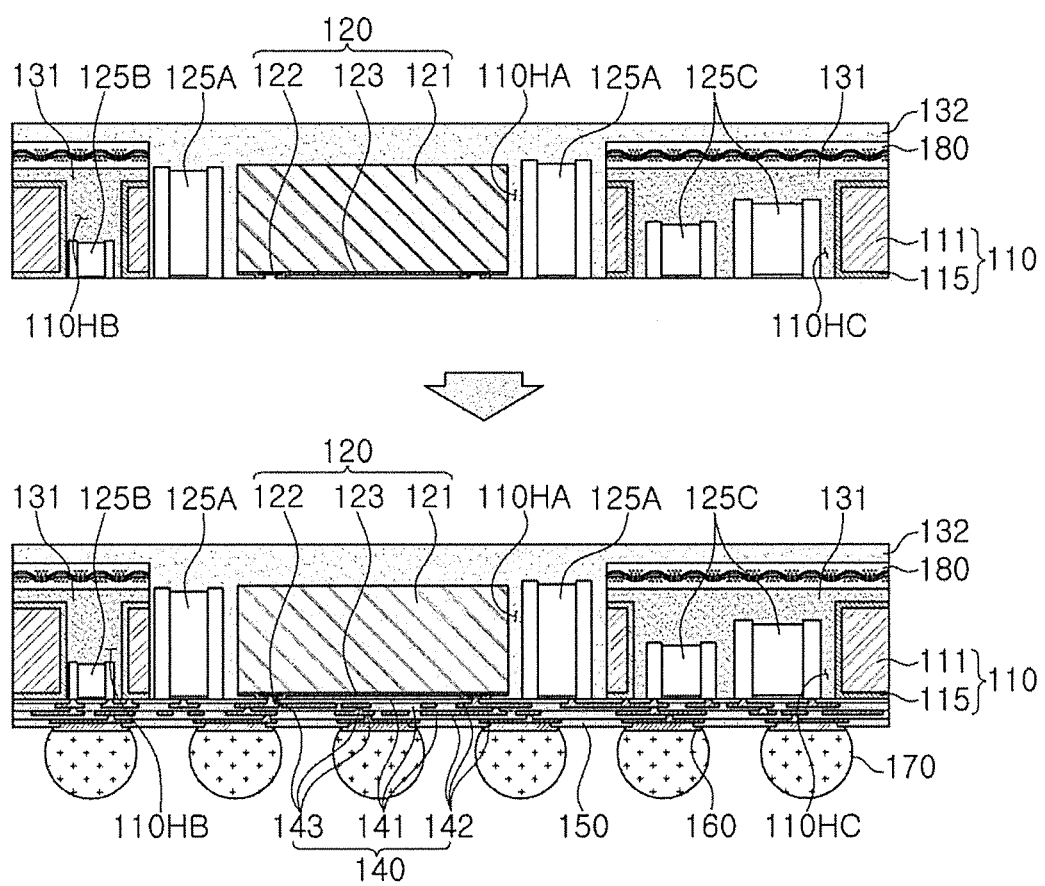

Referring to FIG. 12D, the second adhesive film 212 may then be removed. The second adhesive film 212 may be detached by a mechanical method. The connection member 140 may then be formed in a region of a lower portion from which the second adhesive film 212 is removed. The connection member 140 may be formed in a method in which the insulating layer 141 is formed in a known lamination method or application method, a hole for the via 143 is formed using a photolithography method or a laser drill and/or a mechanical drill, or the like, and the redistribution layer 142 and the via 143 are formed using a known plating method such as electroplating, electroless plating, or the like. The passivation layer 150 may be formed in a known lamination method or application method, the underbump metal layer 160 formed in a known metalization method, and the electrical connection structure 170 formed in a known method.

When the panel 500 of FIG. 11 is used, a plurality of fan-out semiconductor package modules 100A may be manufactured in a single process through a series of operations. Thereafter, respective fan-out semiconductor package modules 100A may be obtained through a dicing process, or the like.

Figure 13:
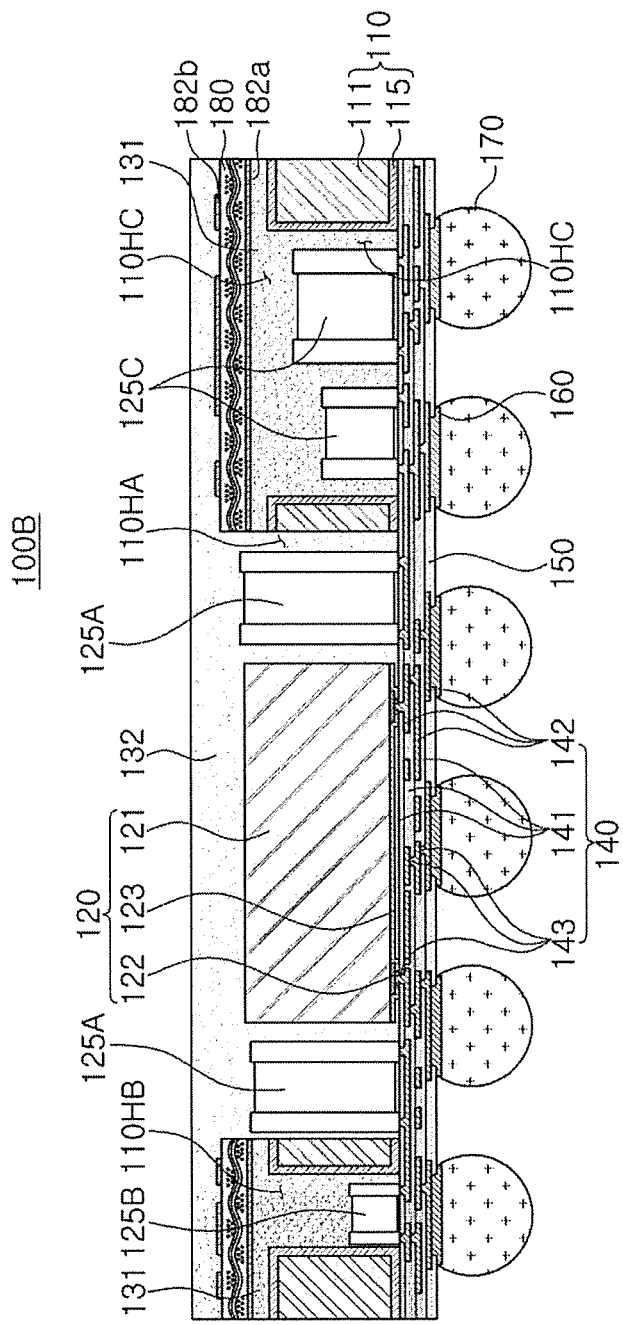
FIG. 13 is a schematic cross-sectional view illustrating another exemplary fan-out semiconductor package module according to the present disclosure.

FIG. 13 is a schematic cross-sectional view illustrating another exemplary fan-out semiconductor package module according to the present disclosure.

Referring to FIG. 13, in a fan-out semiconductor package module 100B according to another exemplary embodiment, metal patterns 182a and 182b are formed on at least one surface of the reinforcing member 180 in the fan-out semiconductor package module 100A. In further detail, a first metal pattern 182a may be formed on a surface of the reinforcing member 180 and in contact with the first encapsulant 131. A second metal pattern 182b may be formed on or in an opposing surface of the reinforcing member, and in contact with the second encapsulant 132. The first metal pattern 182a may have a plate form, and the second metal pattern 182b may have a circuit pattern form, but the first and second metal patterns are not limited thereto. The first metal pattern 182a may have a circuit pattern form and the second metal pattern 182b may have a plate form. In other words, the metal pattern may be formed to be deformed in various forms so as to control warpage. Other configurations and a manufacturing method thereof are substantially the same as those described above, and a description thereof will be omitted.

Figure 14:
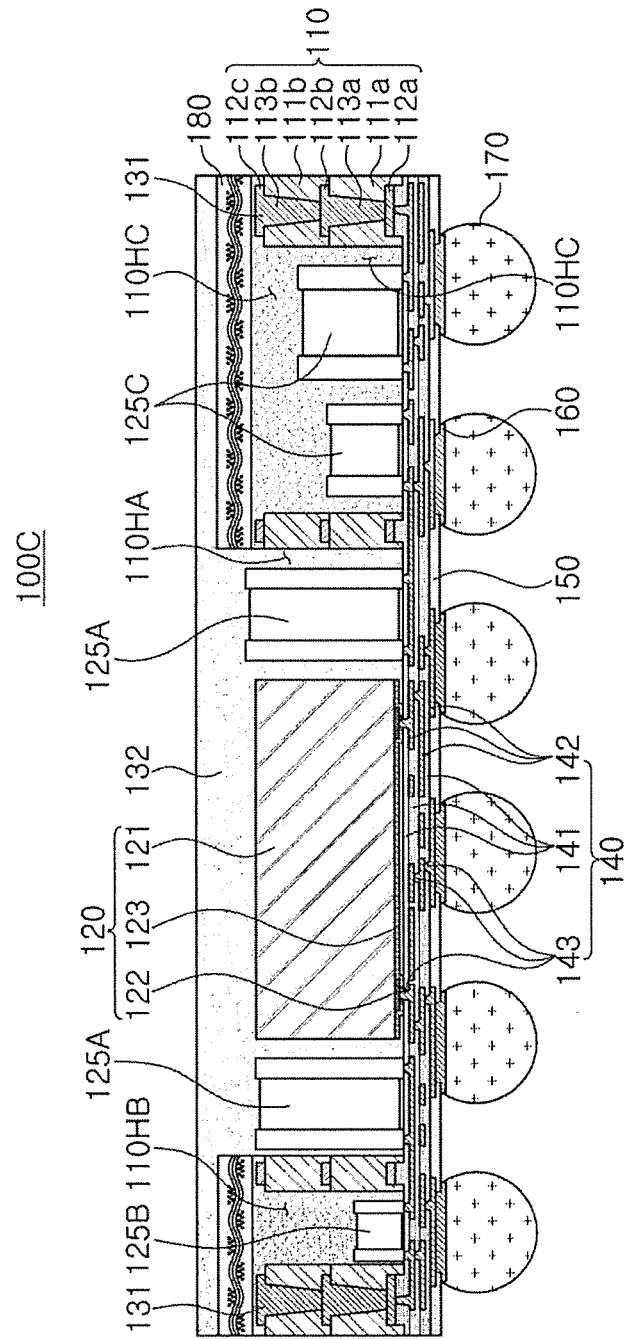
FIG. 14 is a schematic cross-sectional view illustrating another exemplary fan-out semiconductor package module according to the present disclosure.

FIG. 14 is a schematic cross-sectional view illustrating another exemplary fan-out semiconductor package module according to the present disclosure.

Referring to FIG. 14, in a fan-out semiconductor package module 100C according to another exemplary embodiment, a first insulating layer 111a of the core member 110 is in contact with the connection member 140, and a first distribution layer 112a in contact with the connection member 140 and embedded in the first insulating layer 111a. A second distribution layer 112b is disposed in a surface of the first insulating layer 111a opposing the surface in which the first distribution layer 112a is embedded. A second insulating layer 111b is disposed on the first insulating layer 111a and covers the second distribution layer 112b. A third distribution layer 112c is disposed on the second insulating layer 111b. The first, second, and third distribution layers 112a, 112b, and 112c may be electrically connected to the connection pad 122. The first distribution layer 112a and the second distribution layer 112b may be electrically connected to the second distribution layer 112b and the third distribution layer 112c through a first via 113a and a second via 113b penetrating the first insulating layer 111a and the second insulating layer 111b, respectively.

When the first distribution layer 112a is embedded in the first insulating layer 111a, a stepped portion, generated by a thickness of the first distribution layer 112a, is significantly reduced, so an insulation distance of the connection member 140 becomes uniform. In other words, the difference between the distance from the redistribution layer 142 of the connection member 140 to a lower surface of the first insulating layer 111a and the distance from the redistribution layer 142 of the connection member 140 to the connection pad 122 of the semiconductor chip 120 may be smaller than the thickness of the first distribution layer 112a. Thus, the high-density wiring design of the connection member 140 may be facilitated.

A lower surface of the first distribution layer 112a of the core member 110 may be located above a lower surface of the connection pad 122 of the semiconductor chip 120. In addition, the distance between the redistribution layer 142 of the connection member 140 and the first distribution layer 112a of the core member 110 may be greater than the distance between the redistribution layer 142 of the connection member 140 and the connection pad 122 of the semiconductor chip 120. In this regard, the first distribution layer 112a may be recessed into the interior of the insulating layer 111. When the first distribution layer 112a is recessed into the interior of the first insulating layer as described above, and the lower surface of the first insulating layer 111a as well as the lower surface of the first distribution layer 112a have stepped portions, the first distribution layer 112a may be prevented from being contaminated by bleeding of a formation material of the second encapsulant 132. The second distribution layer 112b of the core member 110 may be located between an active surface and an inactive surface of the semiconductor chip 120. The core member 110 may be formed to have a thickness corresponding to a thickness of the semiconductor chip 120. Thus, the second distribution layer 112b formed in the core member 110 may be disposed at a level between the active surface and the inactive surface of the semiconductor chip 120.

The thicknesses of the distribution layers 112a, 112b, and 112c of the core member 110 may be greater than the thickness of the redistribution layer 142 of the connection member 140. The core member 110 is manufactured through a substrate process. In this regard, the distribution layers 112a, 112b, and 112c are also formed to have a larger size according to a scale of the core member. On the other hand, the connection member 140 is manufactured through a semiconductor process. In this regard, the connection member may be formed to have a smaller size than the distribution layers 112a, 112b, and 112c for thinning.

The material of the insulating layers 111a and 111b is not particularly limited. For example, an insulating material may be used as the material of the insulating layers, which may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The distribution layers 112a, 112b, and 112c may be electrically connected to the connection pad 122 of the semiconductor chip 120. In addition, the distribution layers may be electrically connected to the passive components 125A, 125B, 125C, 125D, 125E, and 125F. The material of the distribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The distribution layers 112a, 112b, and 112c may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers may include via pads, wire pads, electrical connection structure pads, and the like.

The vias 113a and 113b may electrically connect the distribution layers 112a, 112b, and 112c, formed in different layers to each other, resulting in formation of an electrical path in the core member 110. The material of the vias 113a and 113b may also be a conductive material. The vias 113a and 113b may be entirely filled with the conductive material, or the conductive material may be formed along a wall of a via hole. In addition, the vias may have various shapes such as a tapered shape and a cylindrical shape. When a hole for a first via 113a is formed, some pads of the first distribution layer 112a may serve as a stopper, so it may be advantageous in terms of process that the first via 113a has a tapered shape in which a width of an upper surface is greater than a width of a lower surface. In this case, the first via 113a may be integrated with a pad pattern of the second distribution layer 112b. Moreover, when a hole for a second via 113b is formed, some pads of the second distribution layer 112b may serve as a stopper, so it may be advantageous in terms of process that the second via 113b has a tapered shape in which a width of an upper surface is greater than a width of a lower surface. In this case, the second via 113b may be integrated with a pad pattern of the third distribution layer 112c.

The core member 110 of the fan-out semiconductor package module 100C according to another exemplary embodiment described above may be applied to the fan-out semiconductor package module 100B according to another exemplary embodiment. Other aspects and a manufacturing method thereof are substantially the same as those described above, and a description thereof is omitted.

Figure 15:
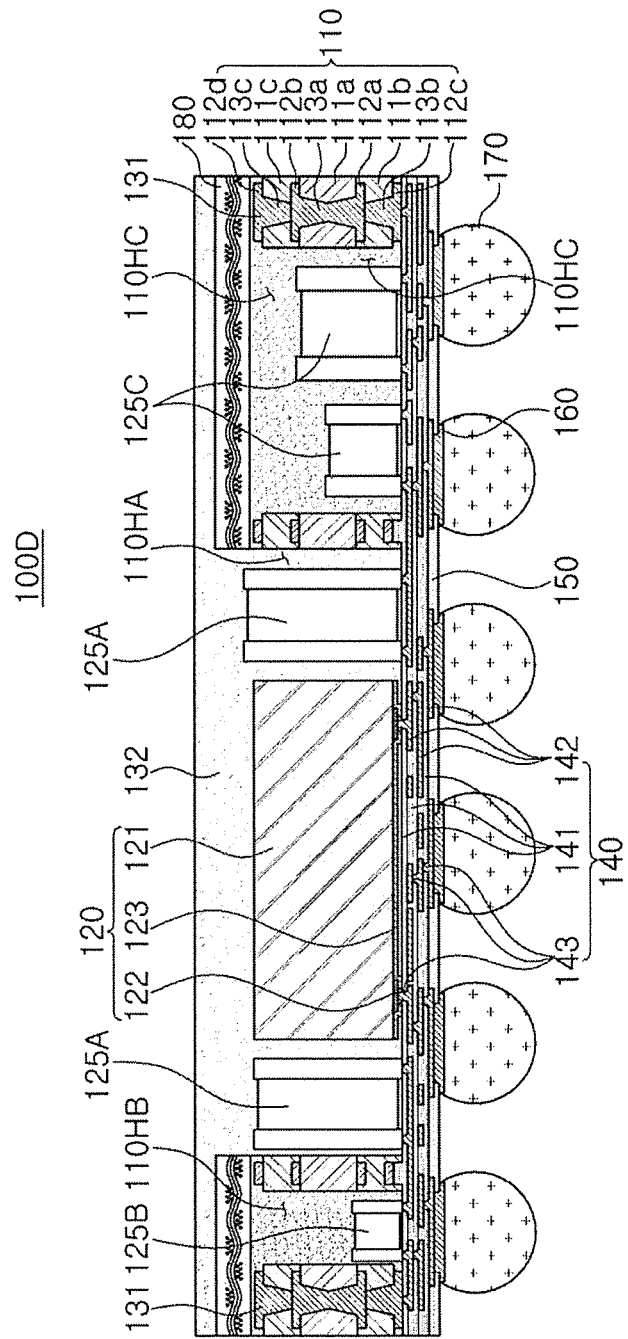
FIG. 15 is a schematic cross-sectional view illustrating another exemplary fan-out semiconductor package module according to the present disclosure.

FIG. 15 is a schematic cross-sectional view illustrating another exemplary fan-out semiconductor package module according to the present disclosure.

Referring to FIG. 15, in a fan-out semiconductor package module 100D according to the present exemplary embodiment, a core member 110 may include a first insulating layer 111a. First and second distribution layers 112a and 112b may respectively be disposed on opposing surfaces of the first insulating layer 111a. A second insulating layer 111b may be disposed on the first insulating layer 111a and may cover the first distribution layer 112a. A third distribution layer 112c may be disposed on the second insulating layer 111b. A third insulating layer 111c may be disposed on the first insulating layer 111a and may cover the second distribution layer 112b. A fourth distribution layer 112d may be disposed on the third insulating layer 111c. The first, second, third, and fourth distribution layers 112a, 112b, 112c, and 112d are electrically connected to the connection pad 122. The core member 110 includes a greater number of distribution layers 112a, 112b, 112c, and 112d, so that the connection member 140 may be further simplified. Thus, reductions in yield caused by defects generated during formation of the connection member 140 may be addressed. Meanwhile, the first, second, third, and fourth distribution layers 112a, 112b, 112c, and 112d may be electrically connected to each other through first, second, and third vias 113a, 113b, and 113c, passing through the first, second, and third insulating layers 111a, 111b, and 111c, respectively.

The first insulating layer 111a may have a greater thickness than those of the second insulating layer 111b and the third insulating layer 111c. The first insulating layer 111a may be relatively thicker to maintain rigidity, while the second insulating layer 111b and the third insulating layer 111c may be introduced to form a greater number of distribution layers 112c and 112d. The first insulating layer 111a may include a different insulating material from the second insulating layer 111b and the third insulating layer 111c. For example, the first insulating layer 111a may include, for example, a prepreg, including a core material, a filler, and an insulating resin, while the second insulating layer 111b and the third insulating layer 111c may be ABF or PID, including a filler and an insulating resin, but the insulating layers are not limited thereto. In a similar manner thereto, the first via 113a, passing through the first insulating layer 111a, may have a larger diameter than those of the second via 113*b* and the third via 113*c*, passing through the second insulating layer 111*b* and the third insulating layer 111*c*.

The lower surface of the third distribution layer 112*c* of the core member 110 may be located lower than the lower surface of the connection pad 122 of the semiconductor chip 120. Moreover, the distance between the redistribution layer 142 of the connection member 140 and the third distribution layer 112*c* of the core member 110 may be less than the distance between the redistribution layer 142 of the connection member 140 and the connection pad 122 of the semiconductor chip 120. In this regard, the third distribution layer 112*c* may be disposed to protrude from the second insulating layer 111*b*, while a thin passivation film may be further formed on the connection pad 122 of the semiconductor chip 120. The first distribution layer 112*a* and the second distribution layer 112*b* of the core member 110 may be located between an active surface and an inactive surface of the semiconductor chip 120. The core member 110 may be formed to correspond to the thickness of the semiconductor chip 120, and the first distribution layer 112*a* and the second distribution layer 112*b*, formed in the core member 110, may be disposed in a level between the active surface and the inactive surface of the semiconductor chip 120.

The thicknesses of the distribution layers 112*a*, 112*b*, 112*c*, and 112*d* of the core member 110 may be greater than the thickness of the redistribution layer 142 of the connection member 140. The distribution layers 112*a*, 112*b*, 112*c*, and 112*d* of the core member 110 may be electrically connected to the connection pad 122 and passive components 125A, 125B, 125C, 125D, 125E, and 125F.

Meanwhile, a core member 110 of a fan-out semiconductor package module 100D according to another exemplary embodiment may be applied to the fan-out semiconductor package module 100B according to another exemplary embodiment described above. Other aspects and a manufacturing method thereof are substantially the same as those described above, and a description thereof is omitted.

Figure 16:
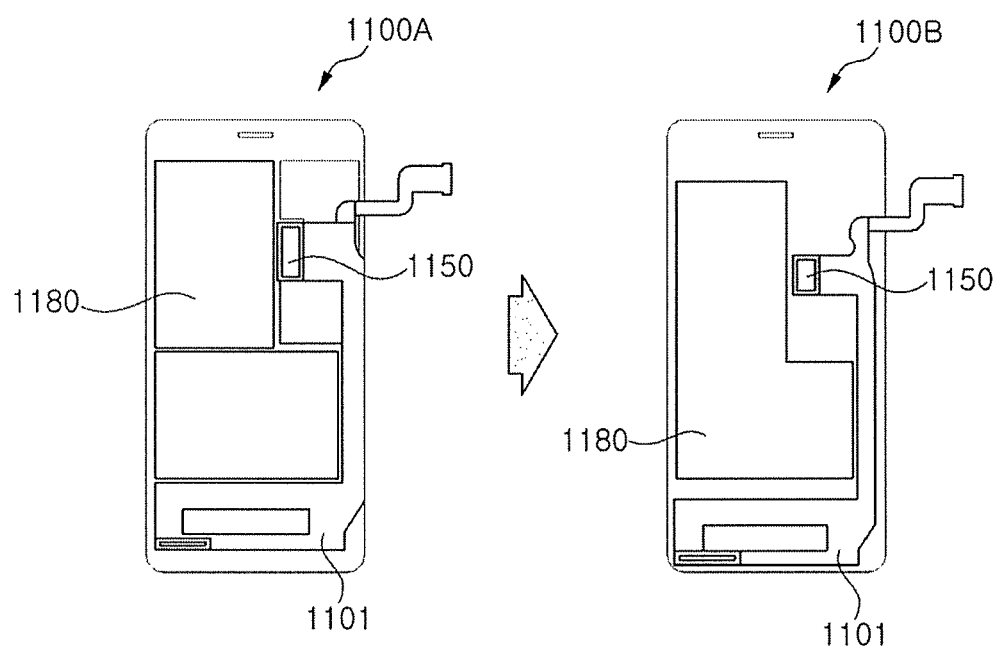
FIG. 16 is a schematic plan view illustrating an effect of using an exemplary fan-out semiconductor package module according to the present disclosure, when applied in an electronic device.

FIG. 16 is a schematic plan view illustrating an effect of the fan-out semiconductor package module according to an exemplary embodiment in the present disclosure when applied to an electronic device.

Referring to FIG. 16, as the size of display devices for mobile devices 1100A and 1100B increases, the battery capacity needs increase. Due to the increased battery capacity, the area occupied by the battery 1180 increases and a reduction in size of the motherboard 1101 is required. Therefore, due to the reduction in mounting area, the area occupied by module 150 including PMIC and passive components steadily decreases. In this case, fan-out semiconductor package modules 100A, 100B, 100C, and 100D according to exemplary embodiments in the present disclosure are applied thereto, and the size of the module 150 is significantly reduced, so a smaller area may be effectively used.

As set forth above, according to an exemplary embodiment, a fan-out semiconductor package module is provided in which the mounting area of the semiconductor chip and a plurality of passive components is significantly reduced, an electrical path between the semiconductor chip and a passive component is significantly reduced, a yield problem is solved, and a resin flow of an encapsulant is easily controlled while warpage of the module is easily controlled.

While exemplary embodiments have been shown and described above, it will be apparent to those skilled in the art that modifications and variations could be made without departing from the scope of the present invention as defined by the appended claims.

What is claimed is:
1. A fan-out semiconductor package module comprising:
a core member having a first through-hole and a second through-hole spaced apart from each other;
a semiconductor chip disposed in the first through-hole, and having an active surface with a connection pad and an inactive surface opposing the active surface;
a first passive component disposed in the second through-hole;
a first encapsulant covering at least portions of the core member and the first passive component, and filling at least a portion of the second through-hole;
a reinforcing member disposed on the first encapsulant to face a first surface of the first passive component;
a second encapsulant covering at least a portion of the semiconductor chip, and filling at least a portion of the first through-hole; and
a connection member disposed on the core member, the active surface of the semiconductor chip, and a second surface of the first passive component opposite to the first surface, the connection member including a redistribution layer electrically connected to the connection pad and to electrode pads on the second surface of the first passive component.

2. The fan-out semiconductor package module of claim 1, further comprising:
a second passive component disposed in the first through-hole, the second passive component and the semiconductor chip being located side by side,
wherein the second encapsulant covers at least a portion of the second passive component, and
the second passive component is electrically connected to the redistribution layer.

3. The fan-out semiconductor package module of claim 2, wherein the second passive component has a thickness greater than that of the first passive component.

4. The fan-out semiconductor package module of claim 2, wherein the semiconductor chip, the second passive component, and the first passive component are located side by side, and are electrically connected to each other through the redistribution layer of the connection member.

5. The fan-out semiconductor package module of claim 4, wherein the connection member further includes a via connecting each of the connection pad, the second passive component, and the first passive component to the redistribution layer, and
each of the connection pad, the second passive component, and the second passive component is physically in contact with the via.

6. The fan-out semiconductor package module of claim 2, wherein the semiconductor chip includes a power management integrated circuit (PMIC), and
each of the second passive component and the first passive component includes a capacitor.

7. The fan-out semiconductor package module of claim 2, wherein the core member further includes a third through-hole, spaced apart, from the first through-hole and the second through-hole,
the third through-hole is provided with a third passive component therein,
the first encapsulant covers at least a portion of the third passive component and fills at least a portion of the third through-hole, and the redistribution layer is electrically connected to the third passive component.

8. The fan-out semiconductor package module of claim 1, wherein the semiconductor chip has a thickness greater than that of the core member.

9. The fan-out semiconductor package module of claim 1, wherein the first through-hole passes through the first encapsulant and the reinforcing member.

10. The fan-out semiconductor package module of claim 1, wherein the second encapsulant covers at least a portion of the reinforcing member.

11. The fan-out semiconductor package module of claim 1, wherein an upper surface of the second encapsulant is located above an upper surface of the first encapsulant.

12. The fan-out semiconductor package module of claim 1, wherein the reinforcing member includes a glass fiber, an inorganic filler, and an insulating resin.

13. The fan-out semiconductor package module of claim 1, wherein at least a surface of the reinforcing member is provided with a metal pattern thereon.

14. The fan-out semiconductor package module of claim 1, further comprising:
a metal layer disposed on a wall of the second through-hole.

15. The fan-out semiconductor package module of claim 14, wherein a wall of the first through-hole is physically in contact with the second encapsulant.

16. The fan-out semiconductor package module of claim 1, wherein the core member includes a first insulating layer in contact with the connection member, a first distribution layer in contact with the connection member and embedded in the first insulating layer, and a second distribution layer in a first surface opposing a second surface in which the first distribution layer of the first insulating layer is embedded, and
the first distribution layer and the second distribution layer are electrically connected to the connection pad.

17. The fan-out semiconductor package module of claim 16, wherein the core member further includes a second insulating layer on the first insulating layer and covering the second distribution layer, and a third distribution layer on the second insulating layer, and
the third distribution layer is electrically connected to the connection pad.

18. The fan-out semiconductor package module of claim 1, wherein the core member includes a first insulating layer, as well as a first distribution layer and a second distribution layer, respectively on opposing surfaces of the first insulating layer, and
the first distribution layer and the second distribution layer are electrically connected to the connection pad.

19. The fan-out semiconductor package module of claim 18, wherein the core member further includes a second insulating layer on the first insulating layer and covering the first distribution layer, a third distribution layer on the second insulating layer, a third insulating layer on the first insulating layer and covering the second distribution layer, and a fourth distribution layer on the third insulating layer, and
the third distribution layer and the fourth distribution layer are electrically connected to the connection pad.

20. The fan-out semiconductor package module of claim 1, wherein the reinforcing member integrally extends over the first passive component.

21. The fan-out semiconductor package module of claim 1, wherein the reinforcing member has a through-hole extending over an entirety of the semiconductor chip.

22. A fan-out semiconductor package module comprising:
a core member having a first through-hole and a second through-hole spaced apart from each other;
a semiconductor chip disposed in the first through-hole, and having an active surface with a connection pad and an inactive surface opposing the active surface;
a first passive component disposed in the second through-hole;
a first encapsulant covering at least portions of the core member and the first passive component, and filling at least a portion of the second through-hole;
a reinforcing member disposed on the first encapsulant;
a second encapsulant covering at least a portion of the semiconductor chip, and filling at least a portion of the first through-hole; and
a connection member disposed on the core member, the active surface of the semiconductor chip, and the first passive component, the connection member including a redistribution layer electrically connected to the connection pad, and the first passive component,
wherein the reinforcing member has an elastic modulus greater than that of the first encapsulant.

23. A fan-out semiconductor package module comprising:
a core member having a first through-hole and a second through-hole;
a reinforcing layer over the core member, having a first through-hole over the first through-hole of the core member, and covering the second through-hole;
a first component in the first through-hole;
a second component in the second through-hole; and
an encapsulant at least covering portions of the reinforcing layer and the first component.

24. The fan-out semiconductor package module of claim 23, wherein the encapsulant includes:
a first encapsulant covering the core member, covering the second component, and in the second through-hole of the core member; and
a second encapsulant covering the reinforcing layer, covering the first component, in the first through-hole of the reinforcing layer, and in the first through-hole of the core member.

25. The fan-out semiconductor package module of claim 23, wherein:
the first component has a first height greater than that of the core member; and
the second component has a second height less than that of the core member.

26. The fan-out semiconductor package module of claim 23, wherein:
the first through-hole of the core member is spaced apart from the second through-hole of the core member; and
the core member includes a metal layer between the first through-hole of the core member and the second through-hole of the core member.

27. The fan-out semiconductor package module of claim 23, wherein the reinforcing layer has an elastic modulus greater than that of the encapsulant.

28. The fan-out semiconductor package module of claim 23, wherein the reinforcing layer integrally extends over the second component.

* * * * *